(12) United States Patent
Nakazawa

(10) Patent No.: US 8,334,711 B2
(45) Date of Patent: Dec. 18, 2012

(54) CONTROL CIRCUIT, CONTROL DEVICE, CONTROL METHOD, AND IMAGE FORMING APPARATUS

(75) Inventor: Hiroyuki Nakazawa, Kasugai (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 105 days.

(21) Appl. No.: 13/040,870

(22) Filed: Mar. 4, 2011

(65) Prior Publication Data

US 2011/0241760 A1   Oct. 6, 2011

(30) Foreign Application Priority Data

Mar. 30, 2010   (JP) .................................. 2010-078771

(51) Int. Cl.
*H03B 1/00*   (2006.01)
(52) U.S. Cl. .............................. 327/108; 327/18; 327/20
(58) Field of Classification Search .................... 327/18, 327/20, 108, 112
See application file for complete search history.

(56) References Cited

U.S. PATENT DOCUMENTS

| | | | |
|---|---|---|---|
| 5,841,362 A | | 11/1998 | Nakamura et al. |
| 6,593,768 B1 * | | 7/2003 | Iyer et al. .......................... 326/30 |
| 6,763,473 B1 | | 7/2004 | Nomizu et al. |
| 6,831,488 B1 * | | 12/2004 | Yoshida ......................... 327/112 |
| 7,436,212 B2 | | 10/2008 | Sakai et al. |
| 2005/0073198 A1 | | 4/2005 | Sakai et al. |

FOREIGN PATENT DOCUMENTS

| | | |
|---|---|---|
| JP | A-64-081412 | 3/1990 |
| JP | 5-225360 | 9/1993 |
| JP | A-06-125261 | 5/1994 |
| JP | 8-223654 | 8/1996 |
| JP | 2001-144888 | 5/2001 |
| JP | A-2005-092480 | 4/2005 |

OTHER PUBLICATIONS

Notification of Reasons for Refusal dated Feb. 16, 2012 received from the Japanese Patent Office from related Japanese Application No. 2010-078771, together with an English-language translation.

* cited by examiner

*Primary Examiner* — An Luu
(74) *Attorney, Agent, or Firm* — Scully, Scott, Murphy & Presser, PC

(57) ABSTRACT

A control circuit comprising an input-output unit that is connected to a signal line, which is connected to an external apparatus, and which is connected to a resistor that is one of a pull-up resistor and a pull-down resistor; a switching unit that switches a mode of the input-output unit to one of an input mode and an output mode, wherein the output mode includes an on-voltage output mode and an off-voltage output mode; an acquisition unit that acquires information regarding whether the resistor connected to the signal line is the pull-up resistor or the pull-down resistor, when the input-output unit is in the input mode; and a control unit that controls the input-output unit to switch to one of the on-voltage output mode and the off-voltage output mode based on the acquisition information acquired by the acquisition unit, when the input-output unit is in the output mode.

13 Claims, 7 Drawing Sheets

CONTROL CIRCUIT, CONTROL DEVICE, CONTROL METHOD, AND IMAGE FORMING APPARATUS

CROSS-REFERENCE TO RELATED APPLICATION

This application claims priority from Japanese Patent Application No. 2010-078771 filed on Mar. 30, 2010, the entire subject matter of which is incorporated herein by reference.

BACKGROUND

1. Technical Field

The invention relates to a control circuit, a control device, a control method, and an image forming apparatus having the control circuit. Specifically, the invention relates to controlling an external apparatus connected via a signal line.

2. Related Art

A related control circuit controlling an external apparatus by connecting to the external apparatus is known. The related control circuit may be connected to the external apparatus via a signal line. One of a pull-up resistor and a pull-down resistor may be connected to the signal line, thus a voltage of the signal line can be stabilized in a non-communication time. In contrast, the pull-up resistor and the pull-down resistor may generate sink currents or source currents in the non-communication time, thereby increasing power consumption in the control circuit. In the related art, a resistor connected to the signal line is limited to the pull-up resistor and a voltage (on-voltage) equal to or higher than a threshold voltage is output from the control circuit to the signal line in the non-communication time, thereby suppressing the power consumption in the control circuit.

SUMMARY

However, in the above described related art, the power consumption in the control circuit may be suppressed only in case that the resistor connected to the signal line is only the pull-up resistor. Often, it was previously unknown whether the resistor connected to the signal line is the pull-up resistor or the pull-down resistor. In this case, it is impossible to determine whether a voltage to be output from the control circuit to the signal line in the non-communication time is set to the on-voltage or a voltage (off-voltage) lower than the threshold voltage. Accordingly, the power consumption in the control circuit may not be suppressed.

The invention is made in consideration of the above, and an object of the invention is to suppress the power consumption in the control circuit in case that it is previously unknown whether the resistor connected to the signal line is the pull-up resistor or the pull-down resistor.

The invention relates to a control circuit controlling an external apparatus. The control circuit includes an input-output unit, a switching unit, an acquisition unit, and a control unit. An input-output unit is connected to a signal line for connecting to the external apparatus. The signal line is connected to a resistor that is one of a pull-up and a pull-down resistor. The switching unit switches a mode of the input-output unit to one of an input mode and an output mode. The output mode includes a mode outputting on-voltage (on-voltage output mode) and a mode outputting off-voltage (off-voltage output) mode. That is, the switching unit switches to one of the input mode, the on-voltage output mode, or the off-voltage output mode. The acquisition unit acquires information about whether the resistor connected to the signal line is the pull-up resistor or the pull-down resistor, when the input-output unit is in the input mode. The control unit controls the input-output unit to switch to one of the on-voltage output mode and the off-voltage output mode based on the acquisition information acquired by the acquisition unit, when the input-output unit is in the output mode.

The invention includes an acquisition unit that acquires the information about whether the resistor connected to the signal line is the pull-up resistor or the pull-down resistor. Accordingly, even if it is previously unknown whether the resistor connected to the signal line is the pull-up resistor or the pull-down resistor, by using the acquisition unit, it is possible to acquire the information about whether the resistor connected to the signal line is the pull-up resistor or the pull-down resistor. The invention controls a mode of an input-output unit based on the acquisition information at the acquisition unit, thereby suppressing the power consumption in the control circuit.

The invention may be embodied also in a control device including the control circuit and the signal line. The invention relates to the control device connected to an external apparatus for controlling the external apparatus. The control device includes a signal line and a control circuit. The signal line is connected to a resistor that is one of a pull-up resistor connected to a power supply voltage and a pull-down resistor connected to a ground voltage. The control circuit includes an input-output unit, a switching unit, and an acquisition unit. The input-output unit is connected to the signal line. The switching unit switches a mode of the input-output unit to one of an input mode and an output mode. The output mode can include an on-voltage output mode and an off-voltage output mode. The acquisition unit acquires information about whether the resistor connected to the signal line is the pull-up resistor or the pull-down resistor, when the input-output unit is in the input mode. The control unit controls the input-output unit to switch to one of the on-voltage output mode and the off-voltage output mode based on the acquisition information acquired by the acquisition unit, when the input-output unit is in the output mode. In accordance with this aspect of the invention, even if it is previously unknown whether the resistor connected to the signal line is the pull-up resistor or the pull-down resistor, it is possible to suppress the power consumption in the control circuit, thereby suppressing the power consumption in the control device.

The invention may be embodied also as a controlling method performed by the control circuit. A controlling method including: (1) connecting an input-output unit to a signal line, which is connected to an external apparatus, and which is also connected to a resistor that is one of a pull-up resistor and a pull-down resistor; (2) switching the input-output unit to an input mode; (3) acquiring information about whether the resistor connected to the signal line is the pull-up resistor or the pull-down resistor during the switching to an input mode; (4) switching the mode of the input-output unit to an output mode after the acquiring; and (5) controlling, during the switching to the output mode, the input-output unit to switch the on-voltage output mode and the off-voltage output mode based on acquisition information acquired during the acquiring. In accordance with this aspect of the invention, even if it is previously unknown whether the resistor connected to the signal line is the pull-up resistor or the pull-down resistor, it is possible to suppress the power consumption in a control drive time.

The invention may be embodied also in an image forming apparatus including the control circuit. The image forming apparatus includes an input-output unit, a switching unit, and an acquisition unit. The input-output unit is connected to the signal line. The switching unit switches a mode of the input-output unit to one of an input mode and an output mode. The output mode can include an on-voltage output mode and an off-voltage output mode. The acquisition unit acquires information about whether the resistor connected to the signal line is the pull-up resistor or the pull-down resistor, when the input-output unit is in the input mode. The control unit controls the input-output unit to switch to one of the on-voltage output mode and the off-voltage output mode based on the acquisition information acquired by the acquisition unit, when the input-output unit is in the output mode. In accordance with this aspect of the invention, even if it is previously unknown whether the resistor connected to the signal line is the pull-up resistor or the pull-down resistor, it is possible to suppress the power consumption in the image forming apparatus.

Accordingly, even if it is previously unknown whether the resistor connected to the signal line is the pull-up resistor or the pull-down resistor, it is possible to suppress the power consumption.

DESCRIPTION OF THE PREFERRED
EXEMPLARY EMBODIMENT

Exemplary Embodiment 1

Figure 1:
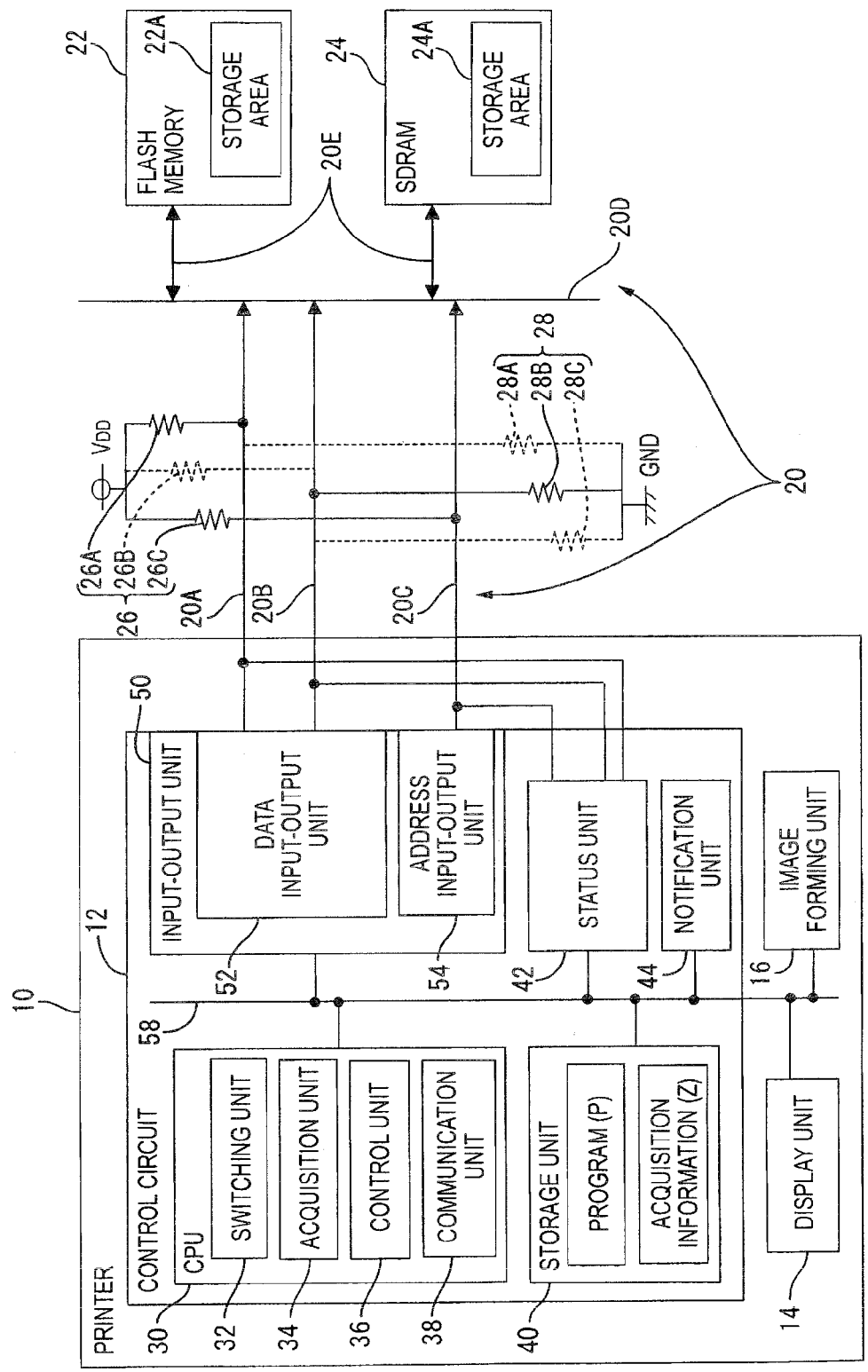
FIG. 1 is a block diagram showing an electrical configuration of a printer 10.

An exemplary embodiment 1 according to the invention will be described with reference to FIG. 1 to FIG. 7.
1. An Electrical Configuration of a Printer FIG. 1 is a block diagram showing a schematic electrical configuration of a printer 10. The printer 10 is connected to external apparatuses such as a flash memory 22 and/or a SDRAM 24 via signal lines 20. The printer 10 may be a laser printer or an ink jet printer. Otherwise, the printer 10 may be multi-function apparatus including such as a facsimile apparatus or a printing function or a scanning function.

The signal lines 20 include data signal lines 20A, 20B for transferring data signals and an address signal line 20C for transferring an address signal. For understanding of the figure, signal lines 20D, 20E is described as one signal line lumped together the data signal lines 20A, 20B and the address signal line 20C. Each of the signal lines 20 is connected to one of the pull-down resistor 28 and the pull-up resistor 26. For specifically example, the pull-up resistor 26A is connected to the signal line 20A (as indicated in a solid line), but the pull-down resistor 28A is not connected to the signal line 20A (as indicated in a broken line). Meanwhile, the pull-down resistor 28B is connected to the signal line 20B (as indicated in a solid line), but the pull-up resistor 26B is not connected to the signal line 20B (as indicated in a broken line). Further, The pull-up resistor 26C is connected to the signal line 20C (as indicated in a solid line), but the pull-down resistor 28C is not connected to the signal line 20C (as indicated in a broken line).

One of the pull-up resistor 26 and the pull-down resistor 28 is connected to each of the signal lines 20, so that the voltage of each of the signal lines may be stabilized when signals from the printer 10 and the external apparatuses 22, 24 are not input to the signal lines 20. That is, in case the pull-up resistor 26 is connected to the signal line 20, the signal line 20 is connected to a power supply voltage VDD via the pull-up resistor 26. In this way, when signals from the printer 10 and the external apparatuses 22, 24 is not input to the signal line 20, the voltage of the signal line 20 may be stabilized with the power supply voltage. On the other hand, in case the pull-down resistor 28 is connected to the signal line 20, the signal line 20 is connected to a ground voltage GND via the pull-down resistor 28, and then the voltage of the signal line 20 may be stabilized with the ground voltage.

Even if one of the pull-up resistor 26 and the pull-down resistor 28 is connected to each of the signal lines 20 in the printer 10, it is previously unknown whether the resistor connected to each of the signal lines 20 is the pull-up resistor 26 or the pull-down resistor 28, in many case. Meanwhile, both of the pull-up resistor 26 and the pull-down resistor 28 are not connected to each of the signal lines 20.

An internal configuration of the printer 10 will be described.

The printer 10 includes a control circuit 12, a display unit 14, and an image forming unit 16. The control circuit 12 includes a CPU 30, a storage unit 40, a status unit 42, a notification unit 44 and an input-output unit 50. The control circuit 12 (including the CPU and other components), the display unit 14 and the image forming unit 16 are interconnected by using an internal interconnection 58.

The display unit 14 includes a liquid crystal display, a lamp, and a speaker, etc., and displays and outputs various set screens, operation modes, setting voices, or the like. The image forming unit 16 follows the instruction of CPU 30 and forms an image based on data signals stored in the storage unit 40 or received from the external apparatuses 22, 24 via the input-output unit 50, and the image forming unit 16 prints the formed image onto papers.

The control circuit 12 controls an operation mode of the printer 10 and an communication mode between the printer 10 and the external apparatuses 22, 24, and switches the operation mode of the printer 10 and the communication mode between the printer 10 and the external apparatuses 22, 24. The control circuit 12 switches the modes among a working mode A (one example of a first mode), a stop mode B (one example of a second mode) and a power-saving mode C (one example of a third mode). The modes A, B, C will be described.
(Working Mode A)

In the working mode A, the control circuit 12 controls the display unit 14 and the image forming unit 16 and executes a given process according to user's instructions such as a printing instruction. Further, the control circuit 12 communicates with the external apparatuses 22, 24. The control circuit 12 switches a mode of the input-output unit 50 to one of the input mode and the output mode and executes an input process and an output process of the data signal and address signal between the external apparatuses 22, 24.

(Stop Mode B)

In the working mode A, when a reset signal is input by the user and the control circuit 12 receives a system initializing instruction, the modes is switched to the stop mode B. The stop mode B includes, for example, the reset mode. In the stop mode B, the control circuit 12 stops controlling the display unit 14 and the image forming unit 16. Further, in the stop mode B, the control circuit 12 stops communication with the external apparatuses 22, 24.

(Power-Saving Mode C)

In the working mode A, when the control circuit 12 has not received any instruction by the user during a reference time T and when a interval of time for which the frequency of communication with the external apparatuses 22, 24 is lower than a reference frequency H continues over the reference time T, the control circuit 12 switches from the working mode A to the power-saving mode C. The power-saving mode C consumes the less power than in the working mode A, and includes, for example, a sleep mode. In the power-saving mode C, the control circuit 12 turns off the screen of the display unit 14 or sets the heater temperature of a fixing unit (not shown) in the image forming unit 16 to the temperature lower than that in the working mode A, and the like. As a result, the control circuit maintains the state at the time that the display unit 14 and the image forming unit 16 switch to a powers-saving mode. Further, in the power-saving mode C, the control circuit 12 aborts the communication with the external apparatuses 22, 24. The control circuit 12 switches the mode of the input-output unit 50 to the output mode and performs an output process.

Each of the various units in the control circuit 12 will be described.

The storage unit 40 stores various programs P to control the printer 10 and the communication with the external apparatuses 22, 24. The CPU 30 performs various functions of the printer 10 following the programs P read from the storage unit 40.

The input-output unit 50 is connected to the signal lines 20. The input-output unit 50 includes a data input-output unit 52 and an address input-output unit 54. The data input-output unit 52 is connected to the data signal lines 20A, 20B. The address input-output unit 54 is connected to the address data line 20C. The CPU 30 controls the mode of the input-output unit 50 and functions as a communication unit 38, which control the communication with the external apparatuses 22, 24.

Figure 2:
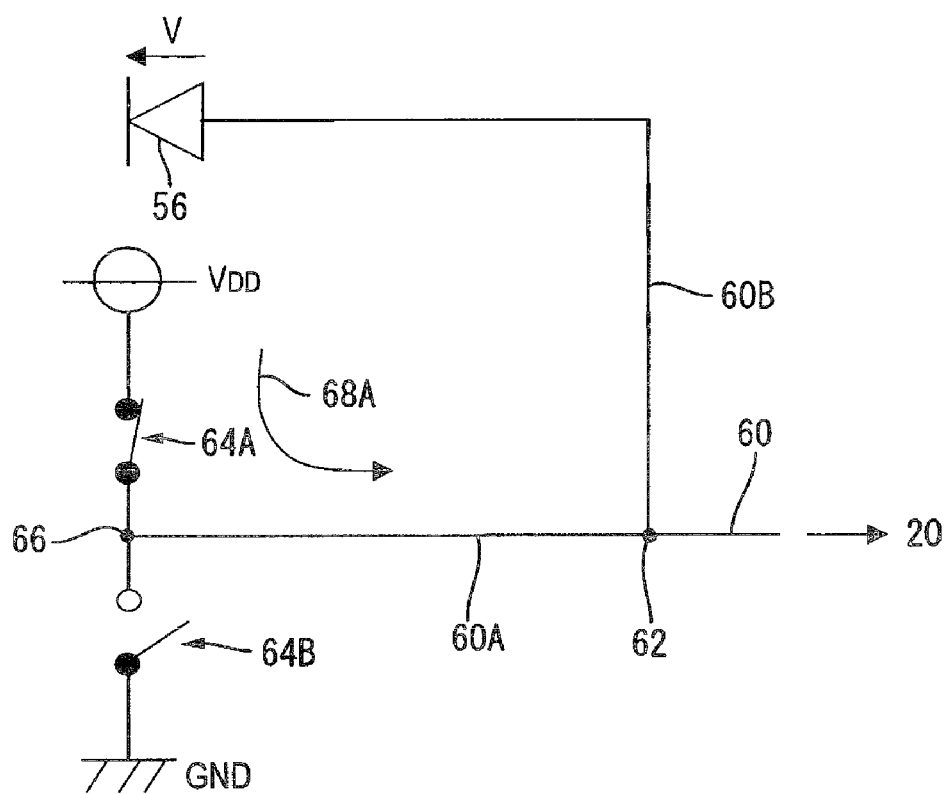
FIG. 2 is a circuit diagram showing an on-voltage output mode of an input-output unit 50.
Figure 3:
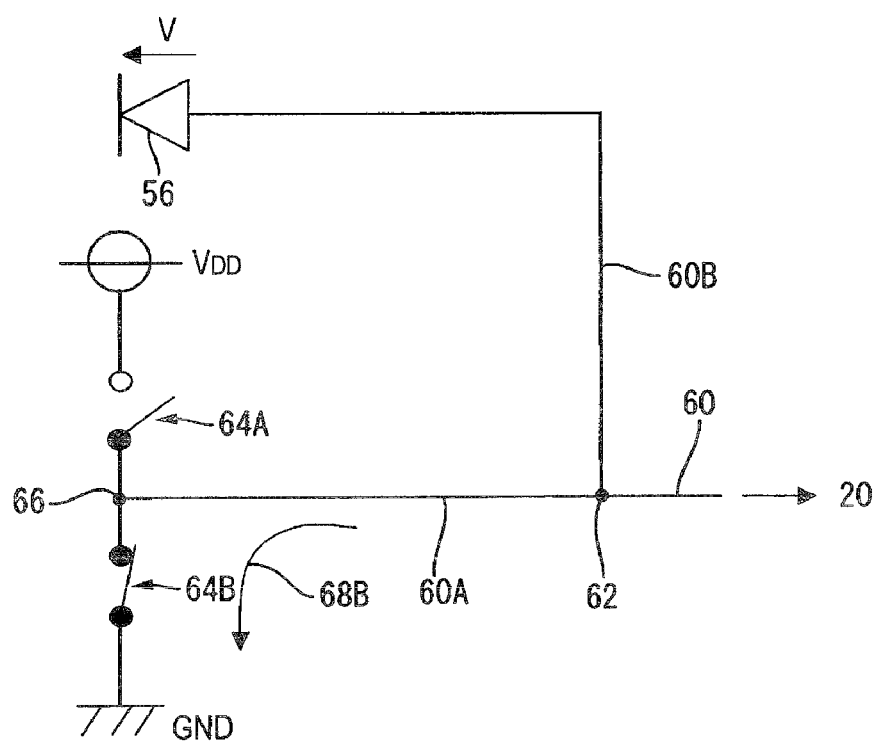
FIG. 3 is a circuit diagram showing an off-voltage output mode of the input-output unit 50.
Figure 4:
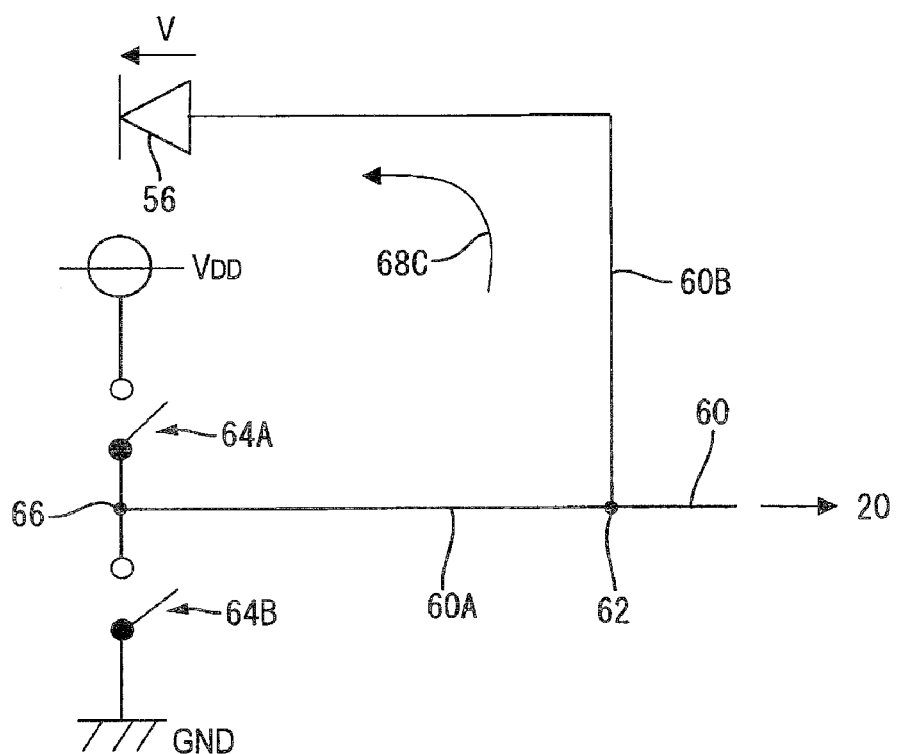
FIG. 4 is a circuit diagram showing an input mode of the input-output unit 50.
Figure 5:
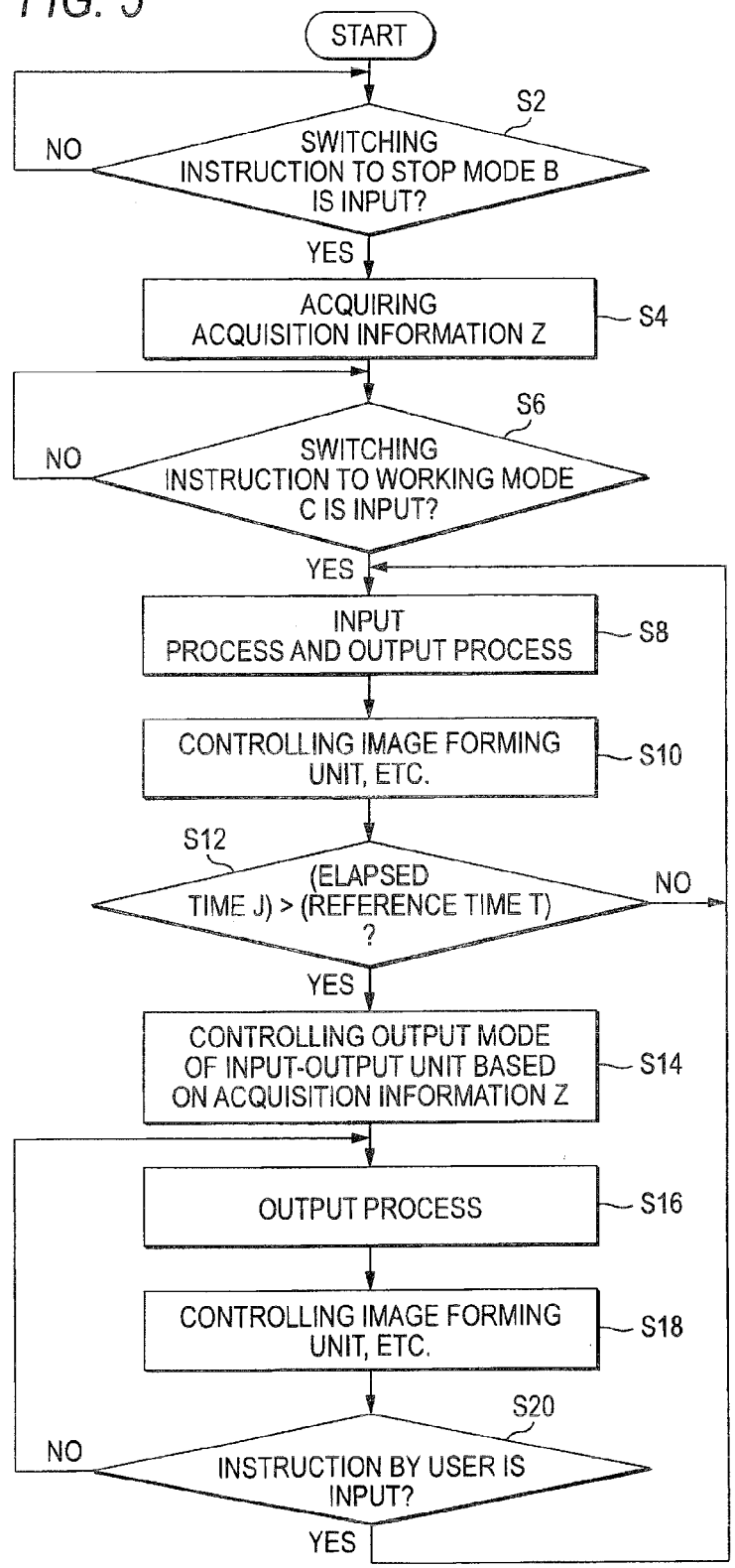
FIG. 5 is a flow-chart showing a process of controlling an output mode of the input-output unit 50 in a power-saving mode C.

FIG. 2 to FIG. 4 show circuit diagrams of the input-output unit 50 connecting to the signal lines 20 in a connection part. In this connection part, a wire 60 is connected to the signal line 20 and is divided into an output side wire 60A and an input side wire 60B at a branch point. An end of the input side wire 60B is connected to a buffer 56 (input unit), and an end of the output side wire 60A is connected to a central point 66 between switches 64A, 64B. The switch 64A is provided between the power supply voltage and the central point 66, the switch 64B is provided between the ground voltage and the central point 66.

The CPU 30 is connected to the switches 64A, 64B, and the CPU 30 controls the input-output unit 50 by turning on/off control. When the CPU 30 switches the mode of the input-output unit 50, it functions as a switching unit that switches the switches 64A, 64B.

When the CPU 30 outputs the on-voltage to the external apparatuses 22, 24 (hereinafter, this may be referred to as "the on-voltage output mode"), the CPU 30 turns on the switch 64A and turns off the switch 64B, as shown in FIG. 2. In this manner, the central point 66 has the power supply voltage, and the power supply voltage is transferred to the external apparatuses 22, 24 via the signal line 20, as indicated in an arrow 68A.

When the CPU 30 outputs the off-voltage to the external apparatuses 22, 24 (hereinafter, this may be referred to as "the off-voltage output mode"), the CPU 30 turns off the switch 64A and turns on the switch 64B, as shown in FIG. 3. In this manner, the central point 66 has the ground voltage, and the ground voltage is transferred to the external apparatuses 22, 24 via the signal line 20, as indicated in an arrow 68B.

When the CPU 30 receives a signal from the external apparatuses 22, 24 (the input mode), the CPU 30 turns off the both switch 64A and the switch 64B, as shown in FIG. 4. In this manner, a voltage is transferred from the external apparatuses 22, 24 or the resistors 26, 28 to the buffer 56 via the signal line 20, as indicated in an arrow 68C.

The buffer 56 has a threshold voltage V operating in a forward direction as shown in an arrow. The threshold voltage V is set to become lower than the power supply voltage and to become higher than the ground voltage. The CPU 30 detects the on-voltage has been input when the voltage is input via the signal line 20 is higher than the threshold voltage V and is input into the input-output unit 50 via the buffer 56. Meanwhile, the CPU 30 detects the off-voltage that has been input when the voltage is input via the signal line 20 is lower than the threshold voltage V and is not input into the input-output unit 50 via the buffer 56.

In the output mode (the working mode A and power-saving mode C), the status unit 42 is connected to the signal lines 20 and receives the data signal and address signal to be transferred from the control circuit 12 to the external apparatuses 22, 24. Reference addresses (one example of a reference output state) corresponding to each storage areas 22A, 24A of the external apparatuses 22, 24 are predefined in the storage unit 40. The status unit 42 is connected to the storage unit 40 via the internal interconnection 58, and the status unit 42 confirms whether the reference addresses stored in the storage unit 40 is identical with address signals actually transferred to the external apparatuses 22, 24 via the address signal line 20C. Further, the status unit 42 is connected to the CPU 30 via the internal interconnection 58, and the status unit 42 confirms whether the output mode of the input-output unit 50 switched by the CPU 30 is identical with the data signal actually transferred to the external apparatuses 22, 24 via the data signal lines 20A, 20B.

The notification unit 44 is connected to the status unit 42 via the internal interconnection 58. In the output mode, the notification unit 44 notifies the user of the abnormal situation using the display unit 14, when the reference addresses stored in the storage unit 40 is not identical with the address signals actually transferred to the external apparatuses 22, 24 or when the output mode of the input-output unit 50 switched by the CPU 30 is not identical with the data signal actually transferred to the external apparatuses 22, 24.

2. An Output Mode Control of the Input-Output Unit 50 in the Power-Saving Mode C An output mode control of the input-output unit 50 of the control circuit 12 in the power-saving mode C will be described with reference to FIG. 5.

When the output mode control is started, the CPU 30 waits for an input of a switching instruction for switching to the stop mode, such as an input of a reset signal ("NO" in step S2). When the switching instruction is input ("YES" in step S2), the mode is switched to the stop mode B. In the stop mode B, the CPU 30 functions as an acquisition unit 34 and acquires the acquisition information Z (in step S4). Here, the CPU 30 determines whether a voltage input from the signal line 20 to the input-output unit 50 is the on-voltage or the off-voltage, and then the CPU 30 stores the determination result as the acquisition information Z.

In the stop mode B, the control circuit 12 stops the communications with the external apparatuses 22, 24, due to operations of the CPU 30. For this reason, any signal is not input from the external apparatuses 22, 24 to the signal line 20. Further, the input-output unit 50 is switched to the input mode due to the operations of the CPU 30, and any signal is not input from the control circuit 12 to the signal line 20. Consequently, in this stop mode B, the voltage of the signal line 20 is decided by the resistors 26, 28 connected thereto.

Accordingly, in the stop mode B, when the pull-up resistor 26 is connected to the signal line 20, the voltage of the signal line 20 is stabilized as the power supply voltage. The voltage of the signal line 20 becomes higher than the threshold voltage V of the buffer 56, and the on-voltage is input to the input-output unit 50. As a result, an on-state is stored as the acquisition information Z in the storage unit 30. In other words, when the on-state is stored as the acquisition information Z in the storage unit 30, it is determined that the pull-up resistor 26 is connected to the signal line 20. On the other hand, in the stop mode B, when the pull-down resistor 28 is connected to the signal line 20, the voltage of the signal line 20 is stabilized as the ground voltage. The voltage of the signal line 20 becomes lower than the threshold voltage V of the buffer 56, and the off-voltage is input to the input-output unit 50. As a result, an off-state is stored as the acquisition information Z in the storage unit 30. In other words, when the off-state is stored as the acquisition information Z in the storage unit 30, it is determined that pull-down resistor 28 is connected to the signal line 20.

In this exemplary embodiment, the acquisition information Z is acquired in the stop mode B. In this way, it may be acquired that the information about whether the resistor connected to the signal line 20 is the pull-up resistor 26 or the pull-down resistor 28.

Next, the CPU 30 waits for an input of the switching instruction for switching the working mode A ("NO" in step S6). When the instruction signal to switch to the working mode A has been input ("YES" in step S6), the mode is switched to the working mode A. In the working mode A, the CPU 30 causes the printer 10 to perform various functions. That is, the control circuit 12 performs the communication including an input process and an output process with the external apparatuses 22, 24, due to operations of the CPU 30 (in step S8). Further, the control circuit 12 controls the image forming unit 16, etc., to perform various functions according to the instructions by the user (in step S10).

The CPU 30 measures an elapsed time J elapsing from that the control circuit 12 is switched to the working mode A or an elapsed time J elapsing from that the previous instruction is inputted by the user. While instructions are input by the user before the elapsed time J goes over a reference time T and the communication frequency with the external apparatuses 22, 24 is higher than a reference frequency H ("NO" in step S12), the CPU 30 repeats the above-mentioned process. While instructions are not input by the user before the elapsed time J goes over a reference time T and the communication frequency with the external apparatuses 22, 24 is lower than a reference frequency H ("YES" in step S12), the CPU 30 switches from the working mode A to the power-saving mode C. In this power-saving mode C, the CPU 30 functions as a control unit 36 to control the output mode of the input-output unit 50 based on the acquisition information Z (in step S14).

As mentioned above, when the on-state is stored as the acquisition information Z in the storage unit 30, it is determined that the pull-up resistor 26 is connected to the signal line 20, and the CPU 30 sets the output mode of the input-output unit 50 corresponding to the signal line 20 to the on-voltage output mode (See FIG. 2). The signal line 20 is connected to the power supply voltage via the pull-up resistor 26 and the switch 64A and is not connected to the ground voltage via the switch 64B. As a result, the sink current flowing from the power supply voltage to the ground voltage is suppressed, and the power consumption in the control circuit is suppressed. On the other hand, as mentioned above, when the off-state is stored as the acquisition information Z in the storage unit 30, it is determined that the pull-down resistor 28 is connected to the signal line 20. The CPU 30 sets the output mode of the input-output unit 50 to the signal line 20 to the off-voltage output mode (See FIG. 3). The signal line 20 is connected to the ground voltage via the pull-down resistor 28 and the switch 64B and is not connected to the power supply voltage via the switch 64A. As a result, the source current flowing from the power supply voltage to the ground voltage is suppressed and thereby the power consumption in the control circuit is suppressed.

In step S16, the control circuit 12 executes the output process according to the controlled output mode in the step S14. Then, The CPU 30 controls the image forming unit 16 to perform the various functions according to the instructions by the user (in step S18).

The CPU 30 keeps the power-saving mode C and repeats the step S16 and step S18 until an instruction is input by the user ("NO" in step S20). When an instruction is input to the control circuit 12 by the user ("YES" in step S20), the CPU 30 switches the mode to the working mode A and performs the step S8 and step S10.

3. A Notification Unit Control of the Input-Output Unit 50 in the Power-Saving Mode C In the output mode control of the input-output unit 50, the output mode of the input-output unit 50 in the power-saving mode C is controlled based on the acquisition information Z acquired in the stop mode B. Accordingly, in the power-saving mode C, the output mode of the address input-output unit 54 may be different from the reference address K stored in the storage unit 40. Further, the output mode of the data input-output unit 52 in the input-output unit 50 is different from the data signal actually transferred to the external apparatuses 22, 24.

(Abnormal Situations)

Figure 6:
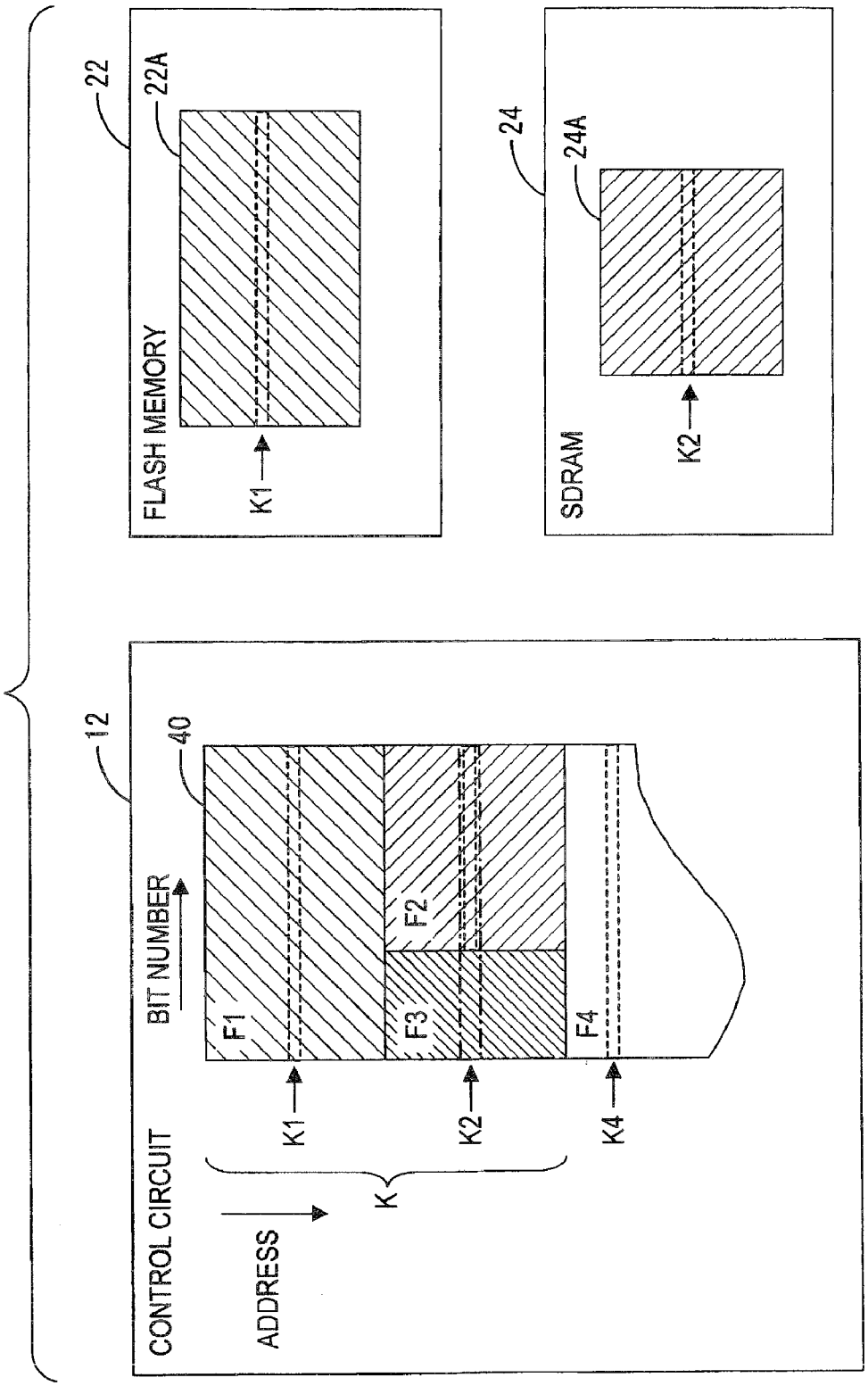
FIG. 6 is schematic views of a storage unit 40 of a control circuit 12 and storage areas 22A, 24A of external apparatuses 22, 24.
Figure 7:
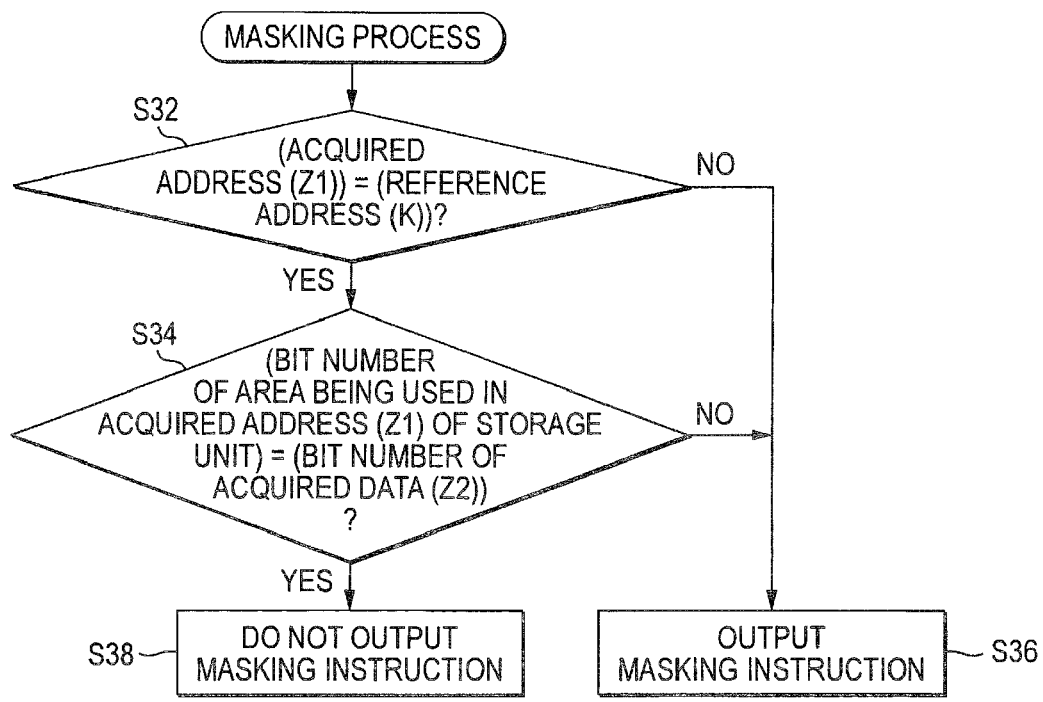
FIG. 7 is a flow-chart showing a notification unit control 50 of the input-output unit 50 in the power-saving mode C.

FIG. 6 shows schematic views of a storage unit 40 of a control circuit 12 and storage areas 22A, 24A of external apparatuses 22, 24. In this figure, vertical positions in each schematic view indicate addresses, and a lateral width indicates a number of the signal lines 20 represented by a bit number. The area F1 of the storage unit 40 is a reserved area corresponding to the storage area 22A of the external apparatus 22, and the area F2 of the storage unit 40 is a reserved area corresponding to the storage area 24A of the external apparatus 24. In the storage unit 40, areas F1, F2 corresponding to other storage areas 22A, 24A have addresses different from each other. An area F3 in the storage unit 40 is a nonuse area, because the bit number of the storage area 24A (corresponding to the bit number of the area F2) is smaller than the bit number of the storage unit 40. An area F4 in the storage unit 40 is a nonuse area, because the area F4 is not corresponded to any storage area of the external apparatuses. In the storage unit 40, addresses corresponding to the areas F1, F2 is corresponding to the reference address K stored in the storage unit 40.

In the working mode A, when the control circuit 12 outputs the data signals to the storage areas 22A, 24A of the external apparatuses 22, 24, the control circuit 12 selects specific addresses (for example, K1, K2) from the reference address K and outputs the data signals (as indicated in broken lines) suitable to the bit numbers of the specific addresses. In this way, the data signals are stored into the specific addresses of the storage areas 22A, 24A of the external apparatuses 22, 24.

Meanwhile, in the power-saving mode C, the control circuit 12 controls the output mode of the input-output unit 50 based on the acquisition information Z. Accordingly, an acquired address Z1 determined based on the acquisition information Z may become the address K4 corresponding to the nonuse area F4. Consequently, the acquired address Z1 is not identical with the reference address K, so that the notification unit 44 notifies the user of the abnormal situation.

Moreover, the acquired address Z1 determined based on the acquisition information Z may become the address K2 corresponding to the area F2. In this case, the acquired address Z1 is identical with the reference address K. On the other hand, the bit number of an acquired data Z2 (as indicated in a dash dot line) determined based on the acquisition information Z is over the bit number of the area F2. The acquired data Z2 is acquired by each signal line 20 and the bit number thereof is identical with the bit number of the storage unit 40. When the acquired data Z2 is output to the address K2, the acquired data Z2 is output to the nonuse area F3. As a result, the output mode of the data input-output unit 56 in the input-output unit 50 is different from the data signal actually transferred to the external apparatuses 22, 24, so that the notification unit 44 notifies the user of the abnormal situation.

Solution for the Problem

In this exemplary embodiment, the CPU 30 executes a masking process so as not to notify the user of the abnormal situations by the notification unit 44 in the power-saving mode C. The masking process by the CPU 30 in the power-saving mode C will be described with reference to FIG. 6 and FIG. 7.

When the masking process is started, the CPU 30 confirms whether the acquired address Z1 is identical with the reference address K (in step S32). If the acquired address Z1 is not identical with the reference address K ("NO" in step S32), the CPU 30 outputs an instruction signal to execute the masking process (in step S36). In this way, even when the acquired address Z1 is not identical with the reference address K, the notification unit 44 is prevented from notification the user of the abnormal situation.

Further, when the acquired address Z1 is identical with the reference address K ("YES" in step S32), the CPU 30 confirms whether the bit number of the area addressed by the acquired address Z1 of the storage unit 40 is equal to the bit number of the acquired data Z2 (in step S34). If the bit number of the area addressed by the acquired address Z1 of the storage unit 40 is not equal to the bit number of the acquired data Z2 ("NO" in the step S34), the CPU 30 outputs an instruction signal to execute the masking process (in step S36). In this way, even when the output mode of the data input-output unit 56 in the input-output unit 50 is different from the data signal actually transferred to the external apparatuses 22, 24, the notification unit 44 is prevented from notifying the user of the abnormal situation. If the bit number of the area addressed by the acquired address Z1 of the storage unit 40 is equal to the bit number of the acquired data Z2 ("YES" in the step S34), the CPU 30 does not output the instruction signal to execute the masking process (in step S38).

In the present exemplary embodiment, the notification unit 44 is actually disabled by executing the masking process in the power-saving mode C. In this manner, the power consumption in the control circuit 12 can be suppressed in the power-saving mode C, and a function detecting abnormal situations of the notification unit 44 is enabled in the working mode A, Another Exemplary Embodiments The invention is not limited to the exemplary embodiments illustrated with reference to the above specification and the drawings, and the following exemplary embodiments are included in the scope of the invention, (1) The external apparatuses 22, 24 are not limited to the flash memory 22 and SDRAM 24, and, for example, computers may be connected as the external apparatuses 22, 24.

(2) Although the storage unit 40 is included in the control circuit 12 in the exemplary embodiment 1, the storage unit 40 may be provided separately from the control circuit 12 in the printer 10. In both cases, the acquisition information Z is stored in the storage unit 40, thereby suppressing the power consumption in the control circuit 12 in the power-saving mode C.

(3) It is preferable that the acquisition information Z is previously stored in the storage unit 40. In this case, the CPU 30 acquires the acquisition information Z from the storage unit 40 and controls the output mode of the input-output unit 50 in the power-saving mode C. In both cases, the output mode of the input-output unit 50 in the power-saving mode C is controlled based on the acquisition information Z, thereby suppressing the power consumption in the control circuit 12 in the power-saving mode C.

The technical elements described in the specification and the drawings achieve their technical utilities in a stand-alone way or in a combinational way thereof, and the combinations are not limited to the combinations written in claims of the present application.

Further, the techniques described in the specification and the drawings can achieve a plurality of the purposes simultaneously, and achieving one of purposes has a merit to accomplish a technical utility.

What is claimed is:

1. A control circuit comprising:
   an input-output unit that is connected to a signal line, which is connected to an external apparatus, and which is connected to a resistor that is one of a pull-up resistor and a pull-down resistor;
   a switching unit that switches a mode of the input-output unit to one of an input mode and an output mode, wherein the output mode includes an on-voltage output mode and an off-voltage output mode;
   an acquisition unit that acquires information regarding whether the resistor connected to the signal line is the pull-up resistor or the pull-down resistor, when the input-output unit is in the input mode; and
   a control unit that controls the input-output unit to switch to one of the on-voltage output mode and the off-voltage output mode based on the acquisition information acquired by the acquisition unit, when the input-output unit is in the output mode.

2. The control circuit according to claim 1,
   wherein, when a voltage input from the signal line to the input-output unit is equal to or higher than a threshold voltage while the input-output unit is in the input mode, the acquisition unit acquires the information that the pull-up resistor is connected to the signal line,
   wherein, when the voltage input from the signal line to the input-output unit is lower than the threshold voltage while the input-output unit is in the input mode, the acquisition unit acquires the information that the pull-down resistor is connected to the signal line.

3. The control circuit according to claim 1,
wherein, when the acquisition unit acquires the information that the pull-up resistor is connected to the signal line, the control unit controls the switching unit so that the output mode of the input-output unit becomes the on-voltage output mode, and
wherein, when the acquisition unit acquires the information that the pull-down resistor is connected to the signal line, the control unit controls the switching unit so that the output mode of the input-output unit becomes the off-voltage output mode.

4. The control circuit according to claim 1, further comprising
a communication unit that controls a communication mode with an external apparatus,
wherein the communication unit switches between:
a first mode, which performs communications with the external apparatus;
a second mode, which stops communications with the external apparatus; and
a third mode, which aborts communications with the external apparatus,
wherein, in the first mode, the communication unit switches the mode of the input-output unit to one of the input mode and the output mode,
wherein, in the second mode, the communication unit switches the mode of the input-output unit to the input mode and causes the acquisition unit to acquire the acquisition information, and
wherein, in the third mode, the communication unit switches the mode of the input-output unit to the output mode.

5. The control circuit according to claim 4,
wherein, in the third mode, the communication unit causes the control unit to control the output mode of the input-output unit.

6. The control circuit according to claim 4,
wherein the second mode is a reset mode.

7. The control circuit according to claim 4,
wherein the third mode is a sleep mode.

8. The control circuit according to claim 4,
wherein, when an interval of time for which a frequency of communication with the external apparatus is lower than a reference frequency continues over a reference time, the communication unit switches the communication mode from the first mode to the third mode.

9. The control circuit according to claim 1, further comprising
a storage unit storing the acquisition information.

10. The control circuit according to claim 4,
wherein the input-output unit includes an address input-output unit that inputs and outputs an address signal,
wherein the control circuit comprises a notification unit that provides notice when the output mode of the address input-output unit is different from a reference output state that is previously defined, and
wherein, in the third mode, the control unit disables the notification unit.

11. A control device connected to an external apparatus for controlling the external apparatus, the control device comprising:
a control circuit; and
a signal line,
wherein the signal line is connected to a resistor that is one of a pull-up resistor connected to a power supply voltage and a pull-down resistor connected to a ground voltage, and
wherein the control circuit comprises:
an input-output unit that is connected to a signal line;
a switching unit that switches a mode of the input-output unit to one of an input mode and an output mode, wherein the output mode includes an on-voltage output mode and an off-voltage output mode;
an acquisition unit that acquires information about whether the resistor connected to the signal line is the pull-up resistor or the pull-down resistor, when the input-output unit is in the input mode; and
a control unit that controls the input-output unit to switch to one of the on-voltage output mode and the off-voltage output mode based on the acquisition information acquired by the acquisition unit, when the input-output unit is in the output mode.

12. A controlling method comprising:
connecting an input-output unit to a signal line, which is connected to an external apparatus, and which is also connected to a resistor that is one of a pull-up resistor and a pull-down resistor;
switching the input-output unit to an input mode;
acquiring information about whether the resistor connected to the signal line is the pull-up resistor or the pull-down resistor during the switching to an input mode;
switching the mode of the input-output unit to an output mode after the acquiring; and
controlling, during the switching to the output mode, the input-output unit to switch the on-voltage output mode and the off-voltage output mode based on acquisition information acquired during the acquiring.

13. An image forming apparatus comprising:
an input-output unit that is connected to a signal line, which is connected to an external apparatus, and which is also connected to a resistor that is one of a pull-up resistor and a pull-down resistor;
a switching unit that switches a mode of the input-output unit to one of an input mode and an output mode, wherein the output mode includes an on-voltage output mode and an off-voltage output mode;
an acquisition unit that acquires information about whether the resistor connected to the signal line is the pull-up resistor or the pull-down resistor when the input-output unit is in the input mode; and
a control unit that controls the input-output unit to switch the on-voltage output mode and the off-voltage output mode based on the acquisition information acquired by the acquisition unit, when the input-output unit is in the output mode.

* * * * *